United States Patent [19]

Sway-Tin et al.

[11] Patent Number: 4,888,637
[45] Date of Patent: Dec. 19, 1989

[54] MULTIPLE SEMICONDUCTOR HEAT SINK/MOUNTING ASSEMBLY

[75] Inventors: Min Sway-Tin, Troy; Daniel P. Merchant, Utica; Thomas J. Mangliers, Grosse Pointe Woods, all of Mich.

[73] Assignee: Chrysler Motors Corporation, Highland Park, Mich.

[21] Appl. No.: 144,208

[22] Filed: Jan. 15, 1988

[51] Int. Cl.4 ...................... H01L 23/34; H01L 23/40
[52] U.S. Cl. .......................................... 357/81; 357/79
[58] Field of Search ....................... 357/81, 82, 74, 79; 361/382, 385; 174/16 HS; 165/80.4

[56] References Cited

U.S. PATENT DOCUMENTS

| | | |
|---|---|---|
| 3,711,752 | 1/1973 | Nier . |
| 3,893,161 | 7/1975 | Pesak, Jr. . |
| 4,115,836 | 9/1978 | Hutchison et al. . |
| 4,203,488 | 5/1980 | Johnson et al. . |
| 4,259,685 | 3/1981 | Romano . |
| 4,288,839 | 9/1981 | Prager et al. . |
| 4,345,267 | 8/1982 | Corman et al. ......................... 357/81 |
| 4,444,994 | 4/1984 | Baker et al. . |
| 4,509,839 | 4/1985 | Lavochkin . |
| 4,593,342 | 6/1986 | Lindsey .................................. 357/81 |
| 4,605,986 | 8/1986 | Bentz et al. ............................ 357/81 |
| 4,609,040 | 9/1986 | Moore . |
| 4,613,925 | 9/1986 | Mohri et al. . |
| 4,625,260 | 11/1986 | Jordan et al. . |
| 4,669,028 | 5/1987 | Faa, Jr. .............................. 361/386 |
| 4,674,005 | 6/1987 | Lacz . |

FOREIGN PATENT DOCUMENTS

| | | | |
|---|---|---|---|
| 0201220 | 7/1983 | Fed. Rep. of Germany ........ 357/81 |
| 0222549 | 12/1983 | Japan .................................... 357/81 |
| 1316086 | 5/1973 | United Kingdom .................. 357/81 |

OTHER PUBLICATIONS

IBM Technical Disclosure Bulletin, vol. 24, No. 7B, Dec. 1981.

Primary Examiner—Rolf Hille
Assistant Examiner—S. V. Clark
Attorney, Agent, or Firm—Mark P. Calcaterra

[57] ABSTRACT

A heat sink assembly to dissipate heat from electrical components to ambient surroundings is disclosed. The heat sink assembly of the present invention includes a housing having a mechanism for retaining electrical components within the housing. The electrical components include heat sink tabs. A mechanism is coupled with the housing and the heat sink tabs of the electrical components to dissipate heat from the electrical components to the ambient surroundings. Also, a mechanism is associated with the assembly to couple the assembly to a circuit board or the like.

17 Claims, 5 Drawing Sheets

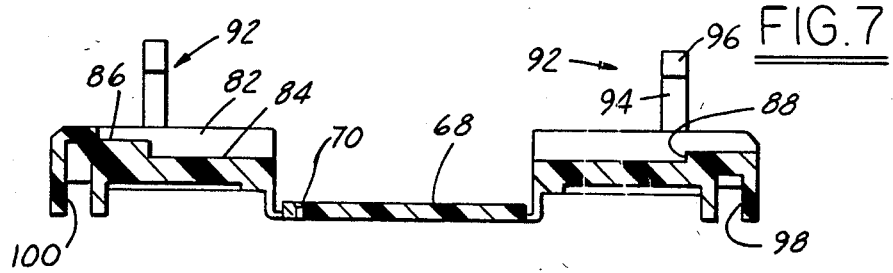
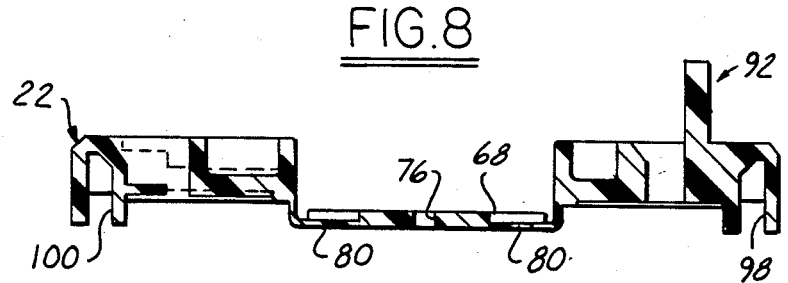
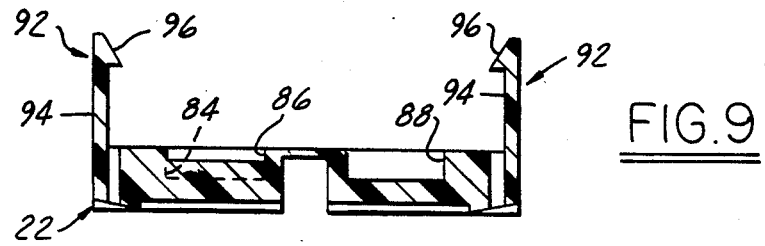
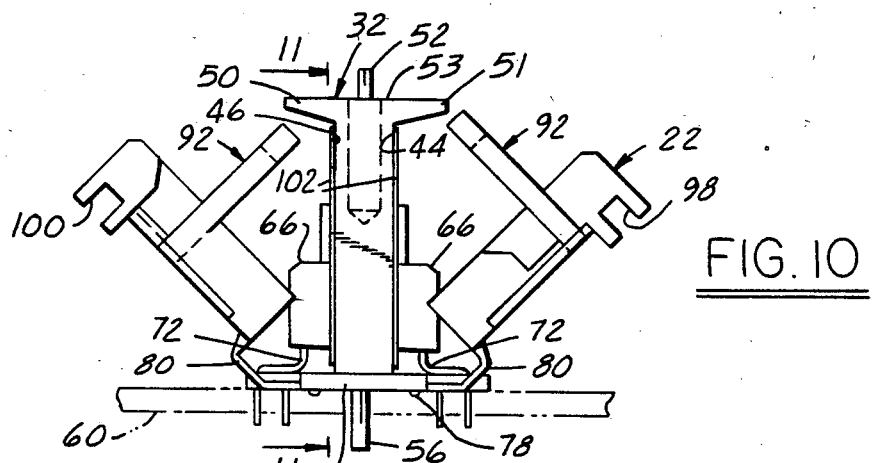
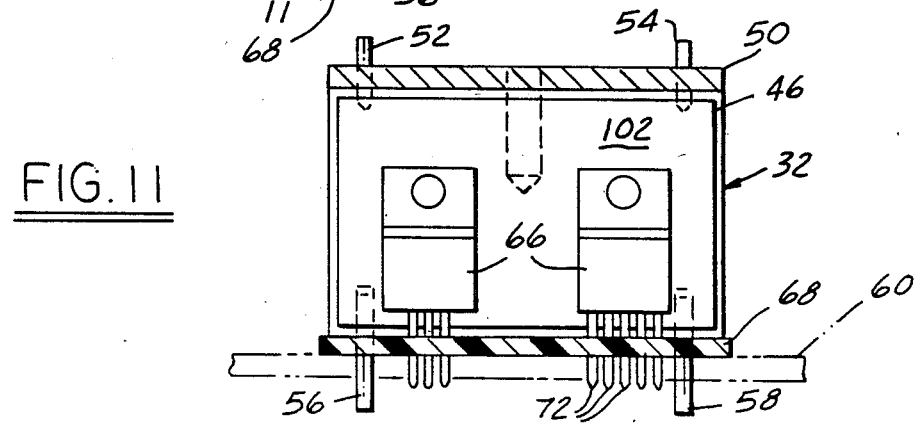

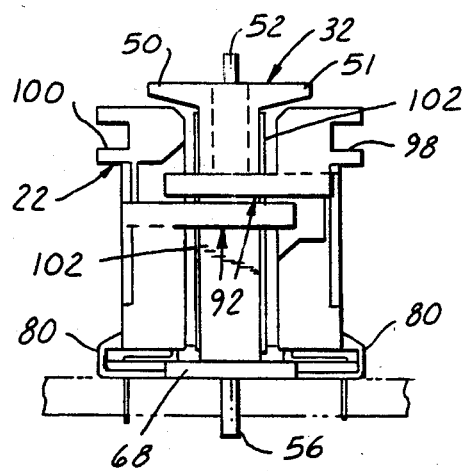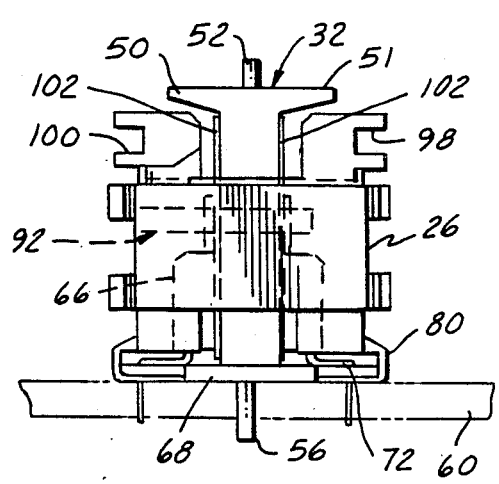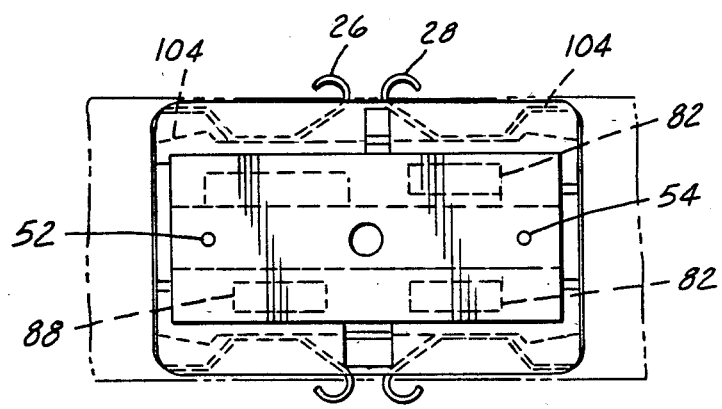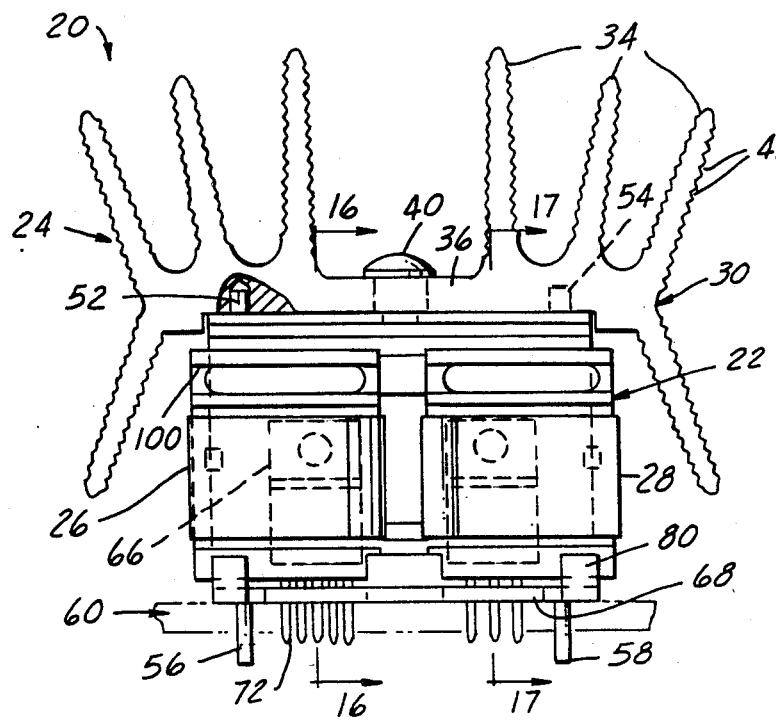

MULTIPLE SEMICONDUCTOR HEAT SINK/MOUNTING ASSEMBLY

BACKGROUND AND SUMMARY OF THE INVENTION

The present invention relates to heat sink assemblies and, more specifically, to heat sink assemblies which are inserted into circuit boards and have heat dissipating members integrally associated with the assembly.

In electronic modules, various components generate amounts of heat which cannot be adequately dissipated to the ambient surroundings without the utilization of a heat sink. Printed circuit boards are used to provide a support for the electrical components and the associated electrical components, generally solid state devices, that make up the electronic module. In order to have an effective transfer of heat from the solid state device to the heat sink, the solid state device must be securely clamped to the heat sink. It is also desirable to have the solid state device mounted to the heat sink with a device that will permit its easy installation with the heat sink and also with the associated circuit board. Further, it is desirable to have the solid state device (heat generating device) in close proximity to the associated circuit board so as to minimize the length of the conductors required for connecting the solid state device to the circuit board.

The following U.S. patents illustrate devices utilized as heat sinks to dissipate heat from electrical components to the ambient conditions. They are U.S. Pat. Nos. 4,674,005, entitled "Multiple Fastening Clip and Device for the Collective Mounting of Electronic Power Components", issued June 16, 1987 to Laca; 4,669,028, entitled "Heat Sink for Solid State Devices Connected to a Circuit Board", issued May 26, 1987 to Faa, Jr.; 4,625,260, entitled "Fasteners for Surface Mounting of Printed Circuit Board Components", issued Nov. 25, 1986 to Jordan et al; 4,613,925, entitled "Sensor Attachment Assembly", issued Sept. 23, 1986 to Mohri et al; 4,609,040, entitled "Self-Securing Heat Sink", issued Sept. 2, 1986 to Moore; 4,509,839, entitled "Heat Dissipator for Semiconductor Devices", issued Apr. 9, 1985 to Lavochkin; 4,444,994, entitled "Electrically Insulated Quick Disconnect Heat Sink", issued Apr. 24, 1984 to Baker et al; 4,288,839, entitled "Solid State Device Mounting and Heat Dissipating Assembly", issued Sept. 8, 1981 to Prager et al; 4,259,685, entitled "Clamp for Securing an Encased Power Frame to a Heat Sink", issued Mar. 31, 1981 to Romano; 4,203,488, entitled "Self-Fastened Heat Sinks", issued May 20, 1980 to Johnson et al; 4,115,836, entitled "Cooling System for Dual-In-Line Packages", issued Sept. 19, 1978 to Hutchison et al; 3,893,161, entitled "Frictionally Engageable Heat Sink For Solid State Devices", issued July 1, 1975 to Pesak, Jr.; 3,711,752, entitled "Semiconductor Device and Method of Assembling the Same", issued Jan. 16, 1973 to Nier; and IBM Technical Disclosure Bulletin, Volume 24, No. 7B, December, 1981.

While the above art appears to perform satisfactorily to dissipate heat from the electrical components, it has several disadvantages. One disadvantage is that several of the above devices utilize removable fasteners such as screws, nuts and bolts, and the like to hold the electrical components in contact with the heat sink. With the cycling (heating and cooling) of the electrical components, it is possible that these connections will be loosened and lose the thermal conductivity to the heat sink due to the cycling. Several of the above devices are very complex and require a significant amount of assembly.

Accordingly, it is an object of the present invention to overcome the disadvantages of the above art. The present invention provides the art with a heat sink assembly which enables electrical components to be in a compact unit and be positioned directly into a circuit board. The present invention may also be positioned onto a circuit board by automated processes.

Accordingly, the present invention provides the art with a new and improved heat sink assembly. The heat sink assembly includes a housing with cavities to retain electrical components within the housing. The electrical components include heat sink tabs. A mechanism is coupled with the mounting portion of the heat sink and the heat sink tabs of the electrical components to dissipate heat from the electrical components to the ambient surroundings. Also, the assembly includes a mechanism to couple the assembly with a circuit board or the like.

From the subsequent description and claims taken in conjunction with the accompanying drawings, other objects and advantages of the present invention will become apparent to those skilled in the art.

BRIEF DESCRIPTION OF THE DRAWINGS

FIG. 7 is a cross-section view of FIG. 3 along line 7—7 thereof.

FIG. 8 is a cross-section view of FIG. 3 along line 8—8 thereof.

FIG. 9 is a cross-section view of FIG. 4 along line 9—9 thereof.

FIG. 10 is a side elevation view of an assembly preassembled.

FIG. 11 is a cross-section view of FIG. 10 along line 11—11 thereof.

FIG. 12 is a side elevation view like that of FIG. 10 with the members in an assembled position.

FIG. 13 is a side elevation view similar to that of FIG. 12 with an assembly clip.

FIG. 14 is a top plan view of FIG. 13.

FIG. 15 is a side elevation view partially in cross-section of a heat sink assembly in accordance with the present invention.

DETAILED DESCRIPTION OF THE PREFERRED EMBODIMENT

Figure 1:
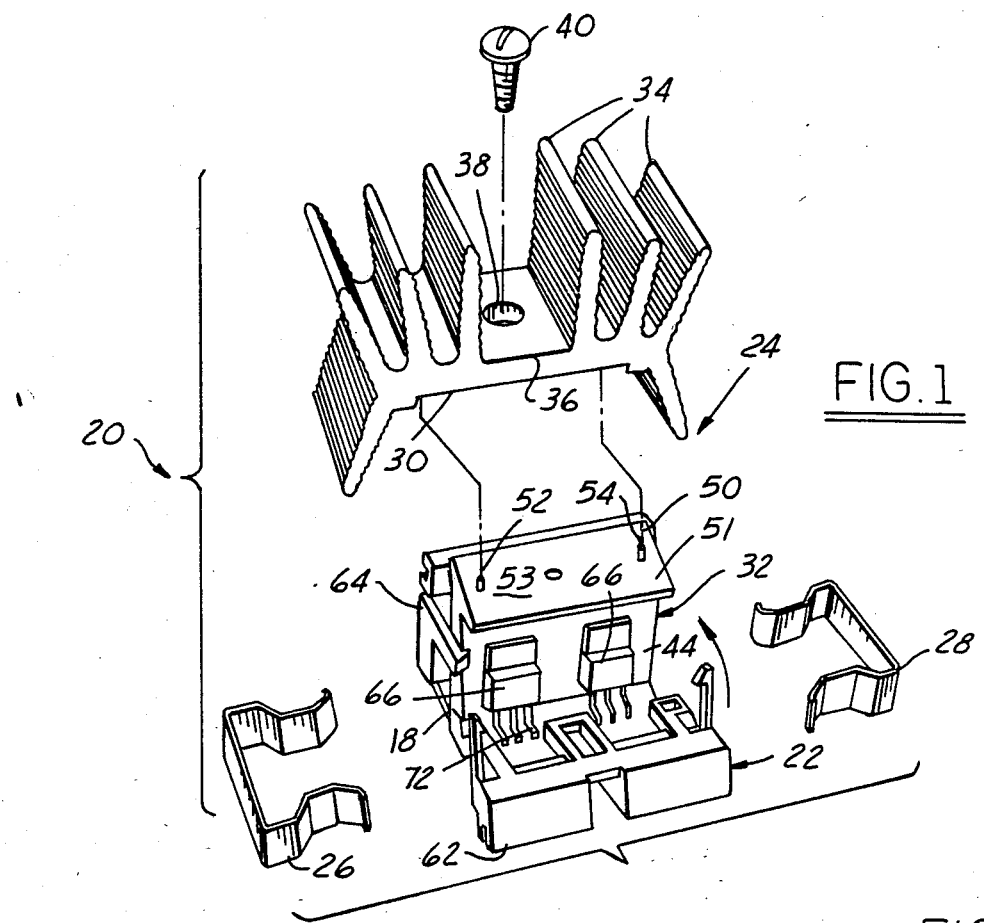
FIG. 1 is an exploded perspective view of a heat sink assembly in accordance with the present invention.
Figure 2:
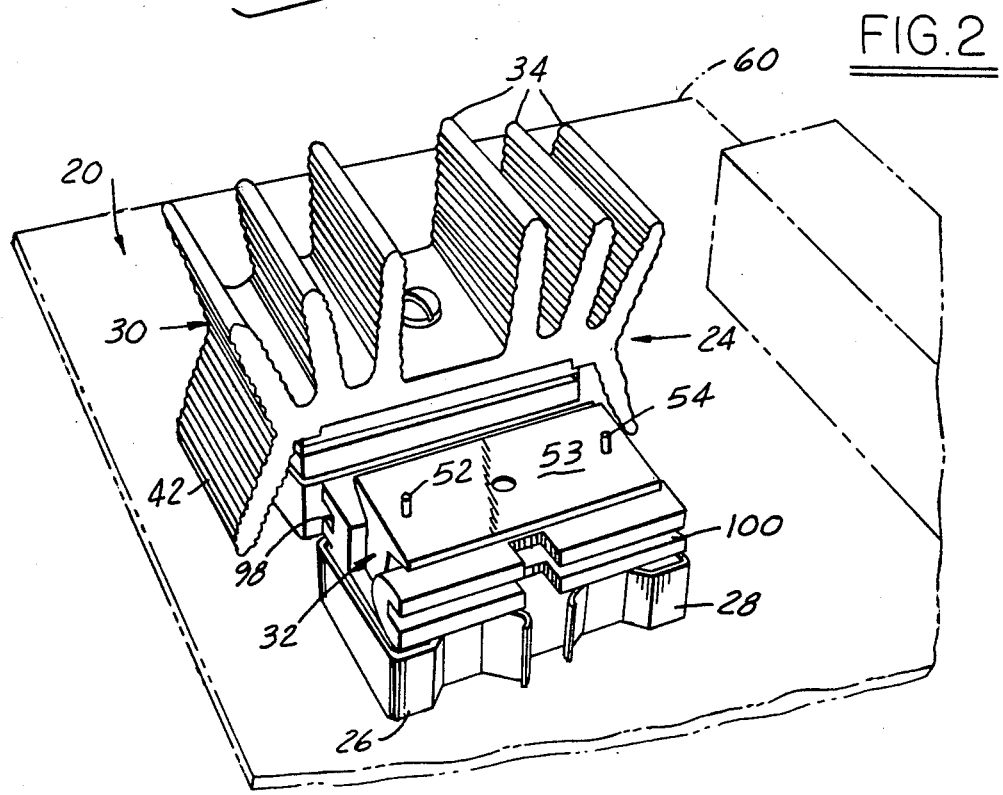
FIG. 2 is a perspective view of an assembled heat sink assembly in accordance with the present invention.

Turning to the figures, particularly FIGS. 1 and 2, a heat sink assembly is shown and designated with the reference numeral 20. The heat sink assembly 20 includes a housing 22 coupled with a heat sink radiator 24 with a pair of securement clips 26 and 28 securing the housing 22 and radiator 24 together to form the heat sink assembly 20.

The heat sink radiator 24 includes a first or radiator portion 30 and a second or mounting portion 32. The radiator portion 30 includes one or more fins 34 having various sizes and shapes projecting from a body 36. The body 36 has an aperture 38 to enable fastener 40 to be positioned therethrough to secure the radiator portion 30 onto the mounting portion 32. Preferably, the fastener 40 is a self-threading screw which secures to the mounting portion 32.

The fins 34 provide a mechanism to dissipate heat away from the electrical components within the housing 22. The fins 34 project in such a way so as to provide maximum air flow around the fins 34, away from the assembly. To enhance the heat dissipation, serrations 42 are cut into the fins 34 to enhance the heat sinking area of the fins 34. Generally, the serrations 42 provide 40% more surface area to dissipate heat than would be provided without the serrations 42. Also, the fins 34 project at different angles from the body 36 to enhance the airflow about the fins 34 to maximize the heat dissipation of the radiator portion 30. The large gap in the center of the heat sink radiator portion 30 enables automatic insertion of the fastener 40 into the hole 38. It is anticipated that such insertion will be done by an arm of a robotic assembly instrument.

It is also noted that the heat sink radiator portion 30 is manufactured symmetrically about the body 36 to enable an even distribution of heat from the electrical components positioned within the assembly 20. This symmetric design also provides to ease the manufacturing of the radiator portion 30. Further, the symmetric design enables installation without concern of a left or right disposition onto the mounting portion 32.

The mounting portion 32, like the radiator portion 30, is manufactured from a heat sink metallic material such as aluminum. The mounting portion 32 generally has an overall T-shape with the vertical leg having a pair of surfaces 44 and 46 abutting the electrical components. The horizontal wings 50 and 51 of the "T" provide a seating surface 53 for the radiator portion 30 of the heat sink. The wings 50 and 51 have a bore therethrough into the vertical portion of the "T" to accept the fastener 40 for securing the radiator portion 30 onto the mounting portion 32. A pair of roll pins 52 and 54 fit into bores in the radiator portion 30 to enhance the seating and positioning of the radiator portion 30 onto the wings surface 53, as seen in FIGS. 1 and 15. Also, at the free end of the vertical "T" portion, a pair of roll pins 56 and 58 retain the mounting portion 32 into the circuit board 60.

The length of the roll pins 52, 54, 56 and 58 and the depth of the holes in the mounting portion 32 is a design choice. Ordinarily, spring roll pins 56 and 58 are longer than the component leads 72 so that the pins 56 and 58 will engage the circuit board 60 before the leads 72, thereby prealigning the leads 72 into the circuit board 60. In a preferred embodiment, the roll pins 52, 54, 56 and 58 are made of rolled sheet metal and are tin plated to accept solder in wave solder automatic assembly processes to mount the entire heat sink assembly 20 to the circuit board 60. The natural tendency of the spring steel is to unravel to cause the roll pins 52, 54, 56 and 58 to be held frictionally in place in the holes on the mounting portion 32.

Referring now to the housing 22, the housing generally has a clamshell design with two wall halves 62 and 64 which come together to sandwich the electrical component 66 against the surfaces 44 and 46 of the mounting portion 32. The two wall halves 62 and 64 are connected by a base 68 which acts as an alignment plate.

The base plate 68 has a plurality of apertures 70 to accept leads 72 from the electrical component 66. The apertures 70 are selected to match the pattern of the particular electrical component to be inserted therethrough. The apertures 70 are of conical shape to guide the insertion of the electrical components leads 72 therethrough by automated assembly equipment. The thickness of the base plate 68 is of significance in that it is thick enough to help ensure the straightness integrity of the electrical components leads 72 as they are inserted into the circuit board 60 in the automated assembly process.

The base plate 68 also includes stand off feet 78 which are designed to keep the base plate 68 and thereby the entire housing assembly 20 above the surface of the circuit board 60. The stand off feet 78 have a two-fold function. First, they enable solder to penetrate through the holes in the circuit board 60 to enable better electrical contact between the leads 72 and the holes in the circuit board 60; and second, they prevent entrapment of particles, which could inadvertently cause stray current paths, underneath the base plate 68 during the washing away and drainage of any solder flecks or cleaning solvents used during the automated assembly process.

Figure 3:
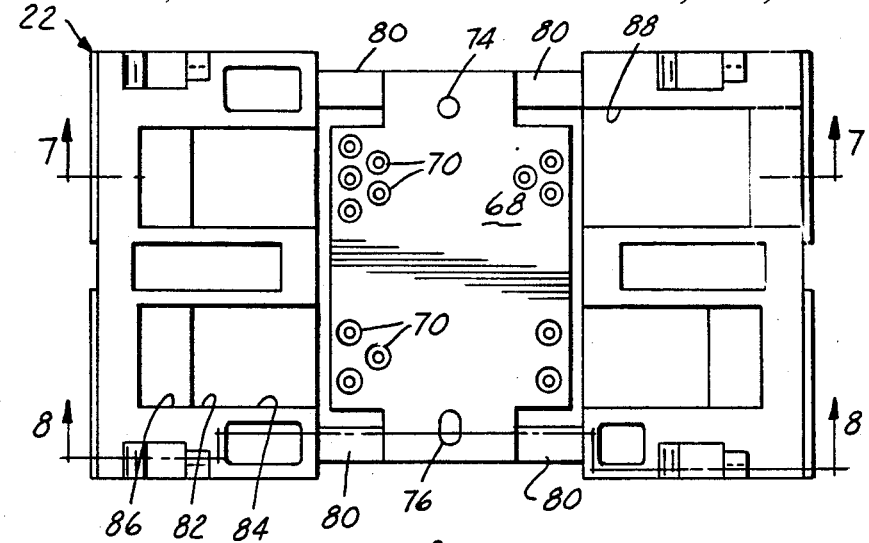
FIG. 3 is a top plan view of an expanded housing in accordance with the present invention.
Figure 4:
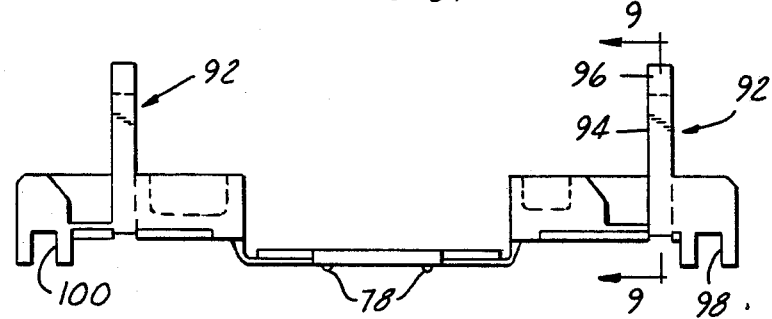
FIG. 4 is a side elevation view of an expanded housing in accordance with the present invention.

The assembly alignment plate 68 includes a pair of roll pin apertures 74 and 76. The holes 74 and 76 communicate with the roll pins 56 and 58 from the mounting portion 32. One of the holes 76 has an oval shape, as seen in the embodiment shown in FIG. 3. The hole 76 provides for different tolerances between the two roll pins 56 and 58 as they are assembled into the mounting portion 32. Also, the hole 76 provides tighter tolerance between it and hole 74. This eliminates the tolerance between the roll pins 56 and 58 and enables keying off of one hole, not two. The hole 76 also compensates for possible tolerance deviation during the manufacturing of the clamshell housing 22.

The halves or shells 62 and 64 are hinged by continuous material portions 80 to the base plate 68. The shells 62 and 64 include cavities 82 to retain the electrical component 66 within the shells 62 and 64. Each cavity 82 may include an electrical component cavity 84 and a heat sink tab cavity 86. However, in embodiments like those shown in FIG. 5, the heat sink tab cavity 86 may be eliminated. Also, the shells 62 and 64 may include a blank cavity 88 to enable flexibility of the shells 62 and 64 during the assembly process. The blank cavities 88 may also be used to enable a variety of different electrical components to be positioned into the housing 22.

Returning back to the hinge portions 80 hinging the shell portions 62 and 64 to the base plate 68, it is to be noted that the hinge design is such that it helps preserve the straightness integrity of the alignment base plate 68 to keep the base plate 68 from bowing. If the alignment base plate 68 bows, the possibility of disturbing a proper solder welding of the electrical component leads 72 increases. Bowing also enables vibration or rocking to occur when the entire heat sink assembly 20 is inserted into the circuit board 60.

Figure 16:
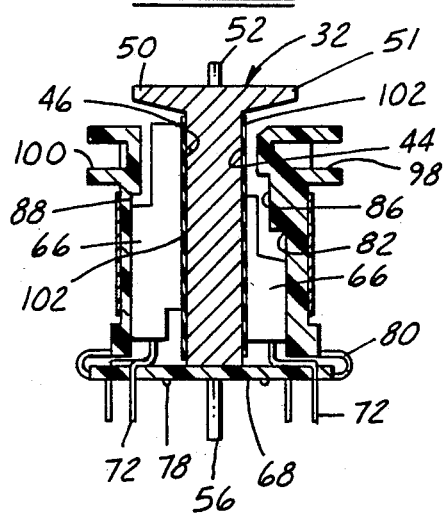
FIG. 16 is a cross-section view of FIG. 15 along line 16—16 thereof.
Figure 17:
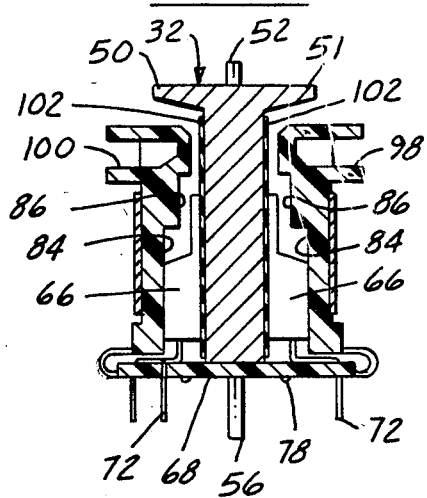
FIG. 17 is a cross-section view of FIG. 15 along line 17—17 thereof.

The hinge portion 80, in the assembled position FIGS. 16 and 17, also enables the lower edge of the shells 62 and 64 to be in close proximity of the knee of the component lead 72. This close proximity limits the vertical movement of the component 66 and assures proper lead protrusion through the circuit board 60.

Figure 5:
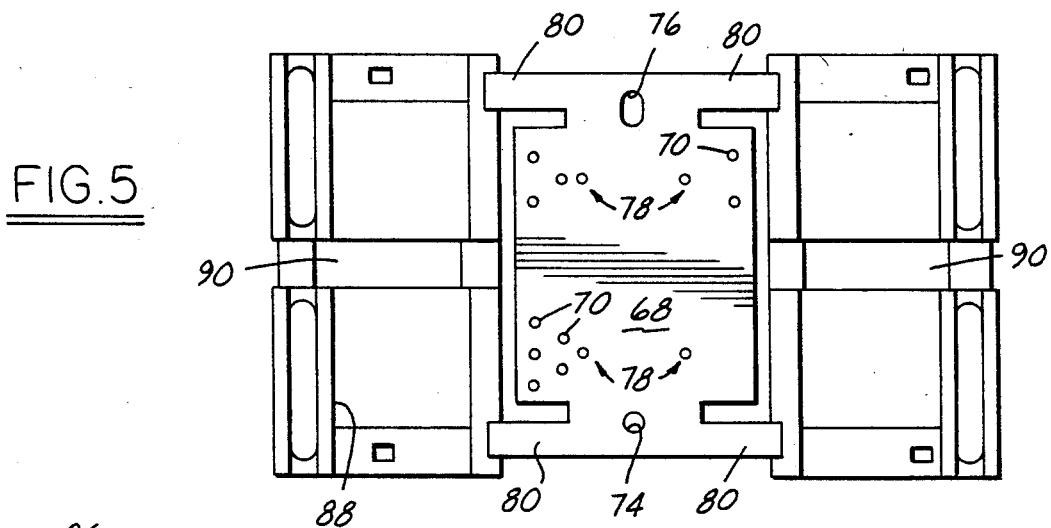
FIG. 5 is a bottom view of an expanded housing in accordance with the present invention.
Figure 6:
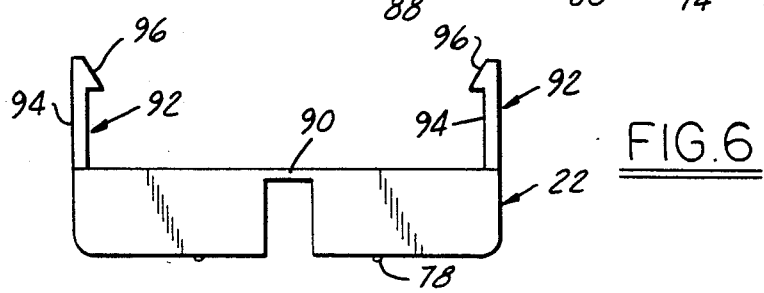
FIG. 6 is an end elevation view of the embodiment of the housing in FIG. 5.

In some embodiments of the housing 22, like that of FIG. 5, hinge portions 90 may be included to hold portions of the shells 62 and 64 together. The hinge 90 enables the shells to adapt to different tolerances in individual electrical components and still provide for uniform mounting pressures of the electrical components 66 inside the heat sink assembly 20. This also enables intimate communication between the shells 62 and 64. Uniform pressure on the electrical components 66 is provided by the securement clips 26 and 28 which are used to urge intimate communications between various portions of the heat sink assembly 20 together. When the clips 26 and 28 are positioned on the outside of the housing 22, the heat sink tabs of the electrical components are in intimate contact with the mounting portion surfaces 44 and 46 for dissipating heat from the electrical components to the heat sink radiator.

Each of the housing shells 62 and 64 also include positioning latches 92. The positioning latches 92 include an arm 94 and tang 96. The tang 96 latches the shell halves 62 and 64 to the mounting portion 32 of the heat sink radiator 24. The latches 92 hold the shell halves 62 and 64 together until attaching of the spring clips 28. The latches 92 may be eliminated and the holding together of the shell halves 62 and 64 may be done by automatic assembly mechanisms. The housing 22 also includes fixture guides 98 and 100 disposed on the outer surface of the housing 22. The fixture guides 98 and 100 enable slidable insertion of the housing assembly 22 into an automated assembly robot.

Also, insulation material, such as insulating tape 102, may be positioned between the electrical component 66 and the surfaces 44 and 46 of the T-shaped mounting portion 32 of the heat sink radiator 24. The insulating material 102 electrically insulates the electrical component 66 from the surfaces 44 and 46. However, the electrical insulating tape 102 acts as a conductor to dissipate heat from the electrical component 66 to the surfaces 44 and 46. Thus, the insulating material 102 insulates against electricity while conducting heat from the electrical component 66 to the mounting portion of the heat sink radiator.

It should also be noted that the electrical components leads 72 are pre-bent in a "shepherds crook" shape to enable thermal expansion and contraction which will occur through the life and the use of the electrical component. More specifically, the "shepherds crook" shape of the semiconductor leads 72 will provide a spring action, giving some latitude of movement to the electrical components as they are fixed at one end by the solder along the lead portion and fixed at the other end by being entrapped within the heat sink assembly 20. This feature also prevents disturbing the die bond inside of the electrical component.

Generally, the heat sink assembly 20 is assembled as follows. Referring to FIG. 10, the electrical components 66 are positioned with the leads 72 through the lead plate base 68. The heat tabs of the electrical components abut surfaces 44 and 46 or insulation material 102 of the vertical leg of the T-shaped mounting portion 30 (see FIG. 11). The shells 62 and 64 are then moved upward until the latching tangs 96 abut the mounting portion 30, as shown in FIG. 12. Once this is accomplished, the securement clips 26 and 28 are positioned around the exterior of the housing shells 62 and 64 to force the heat sink tabs into intimate contact with the mounting portion 32 of the heat sink radiator 24, as seen in FIGS. 13 and 14. The securement clips 26 and 28 are retained on the housing by ribs 104. The ribs 104 prevent the clips 26 and 28 from sliding off the housing. The radiator portion 30 is then positioned over the roll pins 52 and 54 on the horizontal wings 50 and 51 of the mounting portion 32 to seat against the portion. Screw 40 is then positioned into aperture 38 and tightened onto the mounting portion 32. Thus, a heat sink assembly with electrical components 66 therein is ready for assembly onto a circuit board 60 or the like. As mentioned above, varying sizes and types of electrical components may be positioned within the housing 22 of the heat sink assembly 20. FIGS. 16 and 17 illustrate the abutting of the electrical component 66 against the vertical portion of the T-shaped mounting portion 32.

While the above discloses the preferred embodiment of the present invention, it will be understood that modifications, variations and alterations may be made to the present invention without varying from the scope and fair meaning of the subjoined claims.

What is claimed is:

1. A heat sink assembly comprising:
   a housing including a base adapted to be positioned adjacent to a circuit board and defining a plane, one or more walls unitary with said base, said oneor more walls movable from a first position to a second position wherein said one or more walls are substantially transverse to said base, one or more cavities in said one or more walls adapted to receive one or more electrical components when said one or more walls are in said first position, said one or more electrical components including heat sink tabs;
   means for dissipating heat from said one or more electrical components to ambient, said heat dissipating means coupled with said housing and said electrical components heat sink tabs such that said one or more electrical components are received in said one or more cavities when said one or more walls are in said second position so that said one or more electrical components are enclosed by said housing and said heat sink tabs transfer heat from said electrical components to said heat dissipating means; and
   means for coupling said assembly with the circuit board or the like.

2. The heat sink assembly according to claim 1 wherein said means for dissipating heat comprises a first portion inserted into said housing for contacting said heat sink tabs of said electrical components and a second portion including one or more fins for dissipating heat from said electrical components to ambient surroundings.

3. The heat sink assembly according to claim 2 wherein said one or more fins include a plurality of serrations for increasing the surface area of said fins which, in turn, increases heat dissipation.

4. The heat sink assembly according to claim 2 wherein a pair of pins project from said first portion for enabling insertion of said assembly into said circuit board.

5. The heat sink assembly according to claim 1 wherein said housing further comprises a pair of walls pivotally hinged to said base plate.

6. The heat sink assembly according to claim 5 wherein said pair of walls oppose one another in an assembled position such that a gap is formed between said members to enable said heat dissipating means to be positioned between said pair of members.

7. The heat sink assembly according to claim 6 further comprising means for clamping said walls and heat dissipating means together so that said heat sink tabs of said one or more electrical components are in intimate contact with said heat dissipating means, said clamping means positioned about said pair of walls.

8. The heat sink assembly according to claim 5 wherein said base plate includes a plurality of apertures for accepting leads from said electrical components for retaining and aligning said leads for insertion into said circuit board.

9. A heat sink assembly comprising:
a housing formed from nonconductive material, said housing including a base plate adapted to be positioned adjacent to a circuit board and defining a plane, and one or more members extending from said base plate, said one or more members unitarily formed with said base plate and movable with respect to said base plate form a first position to a second position wherein said one or more members are substantially perpendicular to said base plate, said one or more members including one or more cavities for receiving one or more electrical components when said one or more members are in said first position, said electrical components including heat sink tabs;
means for dissipating heat associated with said heat sink tabs of said electrical components and coupled with said housing such that said one or more electrical components are received in said one or more cavity and sandwiched between said one or more members and said heat dissipating means when said one or more members are in said second position so that said one or more electrical components are enclosed by said one or more members and said heat sink tabs transfer heat from said electrical components to said heat dissipating means; and
means for coupling said assembly with the circuit board or the like.

10. The heat sink assembly according to claim 9, said heat dissipating means further comprising one or more fins for dissipating heat from said electrical components to ambient surroundings.

11. The heat sink assembly according to claim 10 wherein said one or more fins include a plurality of serrations for increasing surface area of the fins which, in turn, increases heat dissipation.

12. The heat sink assembly according to claim 9 wherein said housing further comprises hinge means securing a pair of members to said base plate.

13. The heat sink assembly according to claim 12 wherein said pair of members oppose one another in an assembled position such that a gap is formed between said members to enable said heat dissipating means to be positioned between said pair of members.

14. The heat sink assembly according to claim 13 further comprising means positioned about said pair of members for clamping said members and heat dissipating means together so that said heat sink tabs are in intimate contact with said heat dissipating means.

15. The heat sink assembly according to claim 12 wherein said base plate includes a plurality of conical apertures for accepting leads from said electrical components for aligning said leads for insertion into said circuit board.

16. The heat sink assembly according to claim 9 further comprising insulating material positioned between said heat sink tabs and said heat dissipating means for electrically insulating said electrical component from said heat dissipating means while conducting heat from said heat sink tabs to said heat dissipating means for dissipating heat from said electrical components to said heat dissipating means.

17. A heat sink assembly comprising:
a housing including a base adapted to be positioned adjacent to a circuit board and in a plane substantially parallel to the circuit board and a pair of unitary walls pivotally connected to opposing sides of said base, said one or more walls pivoting from a first position to a second position wherein said pair of walls are substantially perpendicular to said base, one or more cavities in each of said walls adapted to receive one or more electrical components with heat sink tabs when said pair of walls are in said first position;
a heat dissipating member coupled with said base and extending in a plane substantially transverse to the base between said walls in said second position;
said one or more electrical components positioned within said housing such that said one or more electrical components are received in said one or more cavities of said walls when said walls are in said second position substantially parallel to said heat dissipating member and said heat sink tabs abutting said heat dissipating member so that heat transfers from said electrical components to said heat dissipating member;
said walls including members for securing the walls with one another when parallel with said heat dissipating member in said second position;
a mechanism for clamping said walls to said heat dissipating member; and
a member for coupling said assembly with the circuit board or the like.

* * * * *